United States Patent
Sakai et al.

(10) Patent No.: US 11,355,670 B2
(45) Date of Patent: Jun. 7, 2022

(54) DEEP ULTRAVIOLET LIGHT EMITTING DEVICE

(71) Applicant: Nikkiso Co., Ltd, Tokyo (JP)

(72) Inventors: Haruhito Sakai, Ishikawa (JP); Noritaka Niwa, Ishikawa (JP); Tetsuhiko Inazu, Ishikawa (JP); Cyril Pernot, Ishikawa (JP)

(73) Assignee: NIKKISO CO., LTD., Tokyo (JP)

( * ) Notice: Subject to any disclaimer, the term of this patent is extended or adjusted under 35 U.S.C. 154(b) by 0 days.

(21) Appl. No.: 16/173,768

(22) Filed: Oct. 29, 2018

(65) Prior Publication Data

US 2019/0067520 A1 Feb. 28, 2019

Related U.S. Application Data

(63) Continuation of application No. PCT/JP2017/014238, filed on Apr. 5, 2017.

(30) Foreign Application Priority Data

May 11, 2016 (JP) .............................. JP2016-095537

(51) Int. Cl.
*H01L 33/20* (2010.01)
*H01L 33/00* (2010.01)
(Continued)

(52) U.S. Cl.
CPC ............ *H01L 33/20* (2013.01); *H01L 33/007* (2013.01); *H01L 33/0025* (2013.01);
(Continued)

(58) Field of Classification Search
CPC ............... H01L 33/0025; H01L 33/007; H01L 33/30–325; H01L 33/20; H01L 33/22; H01L 33/44
See application file for complete search history.

(56) References Cited

U.S. PATENT DOCUMENTS

2006/0145174 A1* 7/2006 Lee .......................... H01L 33/46
257/98
2009/0050916 A1* 2/2009 Katsuno ................. H01L 33/40
257/98
(Continued)

FOREIGN PATENT DOCUMENTS

CN 1735976 A 2/2006
CN 1819282 A 8/2006
(Continued)

OTHER PUBLICATIONS

Machine translation of Hashimoto et al. JP2003-347589 (Year: 2019).*

(Continued)

*Primary Examiner* — Lauren R Bell
(74) *Attorney, Agent, or Firm* — Muncy, Geissler, Olds & Lowe, P.C.

(57) ABSTRACT

A deep ultraviolet light emitting device includes: a light extraction surface; an n-type semiconductor layer provided on the light extraction surface; an active layer having a band gap of 3.4 eV or larger; and a p-type semiconductor layer provided on the active layer. Deep ultraviolet light emitted by the active layer is output outside from the light extraction surface. A side surface of the active layer is inclined with respect to an interface between the n-type semiconductor layer and the active layer, and an angle of inclination of the side surface is not less than 15° and not more than 50°.

5 Claims, 9 Drawing Sheets

(51) Int. Cl.
*H01L 33/32* (2010.01)
*H01L 33/14* (2010.01)
*H01L 33/44* (2010.01)

(52) U.S. Cl.
CPC ............ *H01L 33/145* (2013.01); *H01L 33/32* (2013.01); *H01L 33/44* (2013.01)

(56) References Cited

U.S. PATENT DOCUMENTS

| | | | |
|---|---|---|---|
| 2011/0049550 A1* | 3/2011 | Katsuno | H01L 33/405 257/98 |
| 2012/0258557 A1 | 10/2012 | Yoshizumi et al. | |
| 2015/0091046 A1* | 4/2015 | Lee | H01L 33/0066 438/22 |
| 2015/0255504 A1 | 9/2015 | Jang et al. | |
| 2015/0311392 A1 | 10/2015 | Hirayama et al. | |
| 2016/0005919 A1* | 1/2016 | Obata | H01L 33/32 257/13 |

FOREIGN PATENT DOCUMENTS

| | | |
|---|---|---|
| CN | 101378100 A | 3/2009 |
| CN | 101834250 A | 9/2010 |
| CN | 103928451 A | 7/2014 |
| CN | 104241455 A | 12/2014 |
| CN | 104465928 A | 3/2015 |
| CN | 105009310 A | 10/2015 |
| JP | 2003347589 A | 12/2003 |
| JP | 2005008792 A | 1/2005 |
| JP | 2010141241 A | 6/2010 |
| JP | 5594530 B2 | 5/2012 |
| JP | 2013030817 A | 2/2013 |
| JP | 2015216352 A | 12/2015 |
| KR | 20120129449 A | 11/2012 |
| WO | WO 2005/008792 A1 | 11/2006 |

OTHER PUBLICATIONS

Machine translation of JP2003-347589 (Year: 2020).*
Nam et al., Unique Optical Properties of AlGaN Alloys and Related Ultraviolet Emitters, Applied Physics Letters, Jun. 10, 2004, 84/25.
International Preliminary Examining Authority, International Preliminary Report on Patentability, dated Apr. 5, 2017, 6 pages, with English translation (10 pages).
International Preliminary Examining Authority, Written Opinion of the International Preliminary Examining Authority, dated Apr. 5, 2017, 4 pages, with English translation (8 pages).
International Searching Authority, Written Opinion of the International Seaching Authority, dated May 16, 2017, 3 pages, with English Translation, (6 pages).
Japanese Office Action cited in counterpart application No. 2016-095537, dated May 14, 2019, 3 pages English language translation.
Korean Patent Office. Office Action. dated Oct. 12, 2019 with English Translation. (10 pages).
Office Action dated Sep. 1, 2020 in Chinese Application No. 201780023379.X (18 pages).
Office Action dated Sep. 22, 2020 in Taiwan Application No. TW106112670 (9 pages).

* cited by examiner

DEEP ULTRAVIOLET LIGHT EMITTING DEVICE

RELATED APPLICATION

Priority is claimed to Japanese Patent Application No. 2016-095537, filed on May 11, 2016, the entire content of which is incorporated herein by reference.

BACKGROUND OF THE INVENTION

1. Field of the Invention

The present invention relates to deep ultraviolet light emitting devices.

2. Description of the Related Art

Nowadays, semiconductor light emitting devices such as light emitting diodes and laser diodes that emit blue light have been in practical use. Development of light emitting devices that output deep ultraviolet light having a shorter wavelength has been pursued. Deep ultraviolet light has sterilization capability. Semiconductor light emitting devices capable of outputting deep ultraviolet light have attracted attention as a mercury free sterilization light source in medical and food processing fronts. A light emitting device for emitting deep ultraviolet light includes an aluminum gallium nitride (AlGaN) based n-type clad layer, active layer, p-type clad layer, etc. stacked successively on a substrate.

For example, a deep ultraviolet light emitting device is manufactured by forming a p-side electrode in a first region on the p-type clad layer, removing the active layer and the p-type clad layer in a second region different from the first region to expose the n-type clad layer, and forming an n-side electrode on the n-type clad layer in the second region. The deep ultraviolet light emitted by the active layer is output from a light extraction surface of the substrate.

It is pointed out that the optical characteristics of the AlGaN crystal in AlGaN-based deep ultraviolet light emitting devices vary depending on the AlN composition ratio and that the light extraction efficiency is lowered due to the unique polarizing property of the crystal. If the device is configured to output short-wavelength deep ultraviolet light by increasing the AlN composition ratio in the active layer, the light component propagating in a direction along the interface of the active layer is increased, and the amount of light propagating in a direction intersecting the interface of the active layer and extractable outside from the light extraction surface of the substrate is decreased.

SUMMARY OF THE INVENTION

In this background, one illustrative purpose of the present invention is to provide a technology of increasing the light extraction efficiency of deep ultraviolet light emitting devices.

A deep ultraviolet light emitting device according to an embodiment of the present invention includes: a light extraction surface; an n-type semiconductor layer provided on the light extraction surface; an active layer having a band gap of 3.4 eV or larger; and a p-type semiconductor layer provided on the active layer. Deep ultraviolet light emitted by the active layer is output outside from the light extraction surface. A side surface of the active layer is inclined with respect to an interface between the n-type semiconductor layer and the active layer, and an angle of inclination of the side surface is not less than 15° and not more than 50°.

According to this embodiment, the deep ultraviolet light propagating in a direction along the interface of the active layer is reflected on the side surface of the active layer to change the direction of propagation to a direction intersecting the interface of the active layer, by inclining the side surface of the active layer. In particular, the direction of propagation of the deep ultraviolet light reflected by the side surface of the active layer is changed to a direction that causes the light to be output outside from the light extraction surface, by configuring the angle of inclination of the side surface to be not less than 15° and not more than 50°. In this way, the amount of deep ultraviolet light output from the light extraction surface is increased, and the light extraction efficiency is increased.

The deep ultraviolet light emitting device may further include an n-side electrode provided in a partial region on the n-type semiconductor layer different from the region where the active layer is provided. The side surface of the n-type semiconductor layer may be perpendicular to the interface between the n-type semiconductor layer and the active layer in a range from the interface between the n-type semiconductor layer and the n-side electrode to the light extraction surface.

The deep ultraviolet light emitting device may further include a sapphire substrate having the light extraction surface, wherein the n-type semiconductor layer, the active layer, and the p-type semiconductor layer may be AlGaN-based semiconductor layers.

The deep ultraviolet light emitting device may further include a protective layer covering the side surface of the active layer and transparent to the deep ultraviolet light emitted by the active layer.

An angle of inclination θa of the side surface of the active layer may meet a relationship of the following expression:

$$\theta_a < \frac{\pi/2 + \sin^{-1}(1/n_1)}{2},$$

wherein $n_1$ is a refractive index of the active layer.

An angle of inclination of the side surface of the active layer may be not less than 20° and not more than 40°.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
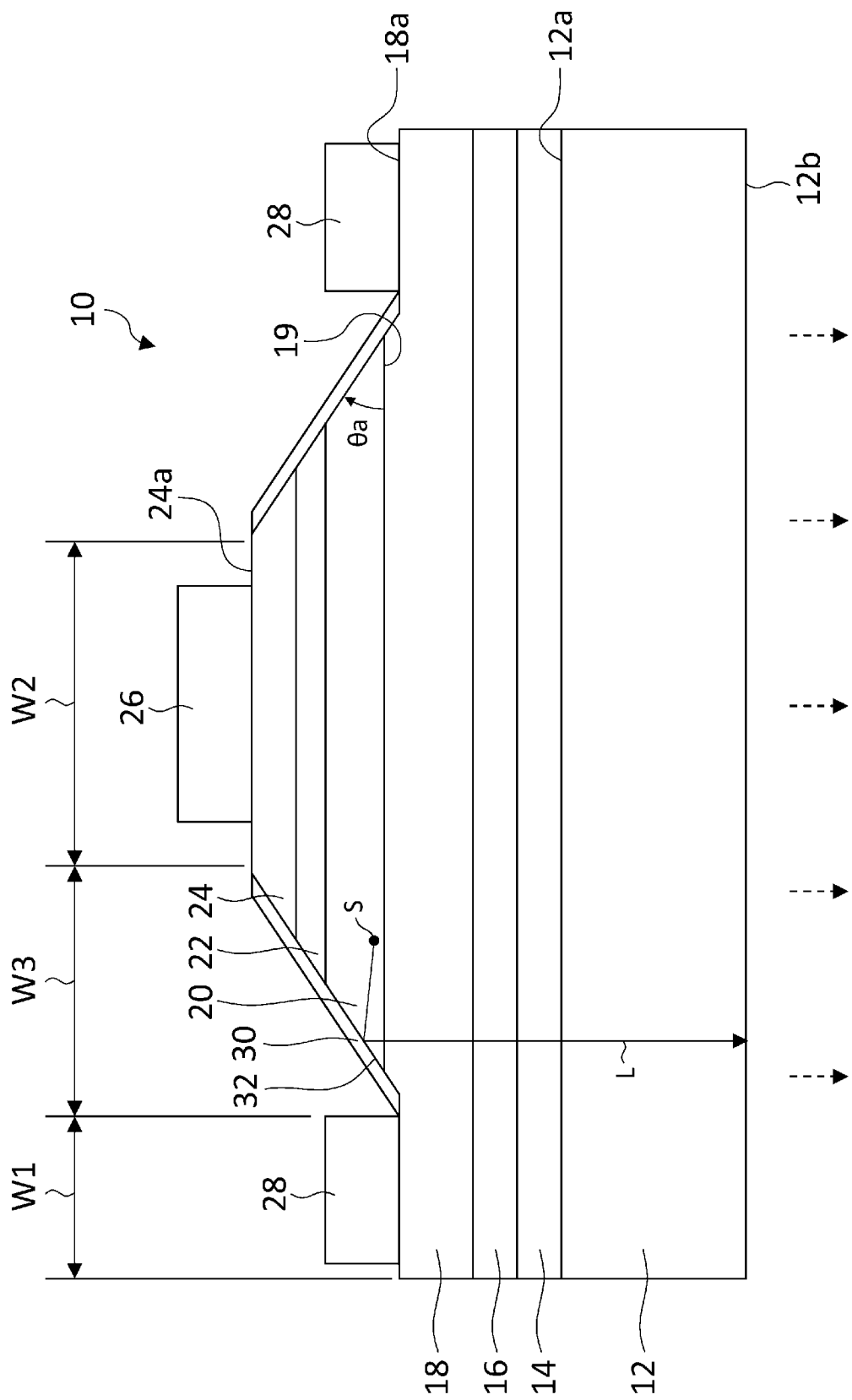
FIG. 1 is a cross sectional view schematically showing a configuration of a deep ultraviolet light emitting device according to the embodiment.

The invention will now be described by reference to the preferred embodiments. This does not intend to limit the scope of the present invention, but to exemplify the invention.

A description will be given of an embodiment of the present invention with reference to the drawings. Like numerals are used in the description to denote like elements and the description is omitted as appropriate. To facilitate the understanding, the relative dimensions of the constituting elements in the drawings do not necessarily mirror the relative dimensions in the actual apparatus.

FIG. 1 is a cross sectional view schematically showing a configuration of a deep ultraviolet light emitting device 10 according to the embodiment. The deep ultraviolet light emitting device 10 includes a substrate 12, a first base layer 14, a second base layer 16, an n-type clad layer 18, an active layer 20, an electron block layer 22, a p-type clad layer 24, a p-side electrode 26, an n-side electrode 28, and a protective layer 30. The deep ultraviolet light emitting device 10 is a semiconductor light emitting device configured to emit "deep ultraviolet light" having a central wavelength A of about 355 nm or shorter. To output deep ultraviolet light having such a wavelength, the active layer 20 is made of an aluminum gallium nitride (AlGaN)-based semiconductor material having a band gap of about 3.4 eV or larger. In this embodiment, the case of emitting deep ultraviolet light having a central wavelength A of about 310 nm or shorter is specifically discussed.

In this specification, the term "AlGaN-based semiconductor material" mainly refers to a semiconductor material containing aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0 \leq x+y \leq 1$, $0 \leq x \leq 1$, $0 \leq y \leq 1$). The AlGaN-based semiconductor material shall contain AlN, GaN, AlGaN, indium aluminum nitride (InAlN), indium gallium nitride (InGaN), and indium aluminum gallium nitride (InAlGaN).

Of "AlGaN-based semiconductor materials", those materials that do not substantially contain AlN may be distinguished by referring to them as "GaN-based semiconductor materials". "GaN-based semiconductor materials" mainly contain GaN and InGaN and encompass materials that additionally contain a slight amount of AlN. Similarly, of "AlGaN-based semiconductor materials", those materials that do not substantially contain GaN may be distinguished by referring to them as "AlN-based semiconductor materials". "AlN-based semiconductor materials" mainly contain AlN and InAlN and encompass materials that additionally contain a slight amount of GaN.

The substrate 12 is a sapphire ($Al_2O_3$) substrate. The substrate 12 includes a crystal growth surface 12a and a light extraction surface 12b. For example, the crystal growth surface 12a is the (0001) plane of the sapphire substrate, and the first base layer 14 and the second base layer 16 are stacked on the crystal growth surface 12a. The first base layer 14 is a layer made of an AlN-based semiconductor material and is, for example, an AlN(HT-AlN) layer gown at a high temperature. The second base layer 16 is a layer made of an AlGaN-based semiconductor material and is, for example, an undoped AlGaN(u-AlGaN) layer.

The substrate 12, the first base layer 14, and the second base layer 16 function as a foundation layer (template) to form the n-type clad layer 18 and the layers above. These layers also function as a light extraction substrate for extracting the deep ultraviolet light emitted by the active layer 20 outside and transmit the deep ultraviolet light emitted by the active layer 20. Accordingly, the deep ultraviolet light emitted by the active layer 20 is output outside from the light extraction surface 12b of the substrate 12. The light extraction surface 12b may be a texture surface formed with a micro-asperity structure of a submicron or submillimeter scale instead of a flat surface. By forming a texture structure on the light extraction surface 12b, reflection or total reflection on the light extraction surface 12b is inhibited and the light extraction efficiency is increased.

The n-type clad layer 18 is an n-type semiconductor layer provided on the second base layer 16. The n-type clad layer 18 is made of a n-type AlGaN-based semiconductor material. For example, the n-type clad layer 18 is an AlGaN layer doped with silicon (Si) as an n-type impurity. The composition ratio of the n-type clad layer 18 is selected to transmit the deep ultraviolet light emitted by the active layer 20. For example, the n-type clad layer 18 is formed such that the molar fraction of AlN is 40% or higher, and, preferably, 50% or higher. The n-type clad layer 18 has a band gap larger than the wavelength of the deep ultraviolet light emitted by the active layer 20. For example, the n-type clad layer 18 is formed to have a band gap of 4.3 eV or larger. The n-type clad layer 18 has a thickness of about 100 nm-300 nm. For example, the n-type clad layer 18 has a thickness of about 200 nm.

The n-side electrode 28 is formed on a first region W1 of the n-type clad layer 18. The active layer 20 is provided on a region of the n-type clad layer 18 different from the first region W1 (a second region W2 and a third region W3).

The n-side electrode 28 is provided on the n-type clad layer 18 and is formed in the first region W1. For example, the n-side electrode 28 is formed by a titanium (Ti)/Al/Ti/Au stack structure. For example, the thickness of the first Ti layer is about 20 nm, the thickness of the Al layer is about 100 nm, the thickness of the second Ti layer is about 50 nm, and the thickness of the Au layer is about 100 nm.

An n-type contact layer may be provided between the n-type clad layer 18 and the n-side electrode 28 to lower the contact resistance between the n-type clad layer 18 and the n-side electrode 28. The n-type contact layer may be made of an AlGaN-based semiconductor material or a GaN-based semiconductor material of an n-type having a composition ratio selected such that the Al content percentage thereof is lower than that of the n-type clad layer 18. It is preferable that the molar fraction of AlN in the n-type contact layer is 20% or lower, and it is more preferable that the molar fraction of AlN is 10% or lower.

The active layer 20 is formed on the n-type clad layer 18. The active layer 20 is made of an AlGaN-based semiconductor material and has a double heterojunction structure by being sandwiched by the n-type clad layer 18 and the electron block layer 22. The active layer 20 may form a monolayer or multilayer quantum well structure. The quantum well structure like this can be formed by building a stack of a barrier layer made of an n-type AlGaN-based semiconductor material and a well layer made of an undoped AlGaN-based semiconductor material. To output deep ultraviolet light having a wavelength of 355 nm or shorter, the active layer 20 is formed to have a band gap of 3.4 eV or larger. For example, the composition ratio of the active layer 20 is selected so as to output deep ultraviolet light having a wavelength of 310 nm or shorter.

The electron block layer 22 is a p-type semiconductor layer provided on the active layer 20. The electron block layer 22 is a layer made of a p-type AlGaN-based semiconductor material and is exemplified by a Mg-doped AlGaN layer. The composition ratio of the electron block layer 22 is selected such that the molar fraction of AlN in the electron block layer 22 is higher than that of the active layer 20 or the p-type clad layer 24. For example, the electron block layer 22 is formed such that the molar fraction of AlN is 40% or higher, and, preferably, 50% or higher. The electron block layer 22 may be formed such that the molar fraction of AlN is 80% or higher or may be made of an AlN-based semiconductor material that does not substantially contain GaN. The electron block layer 22 has a thickness of about 1 nm-10 nm. For example, the electron block layer 22 has a thickness of about 2 nm-5 nm.

The p-type clad layer 24 is a p-type semiconductor layer provided on the electron block layer 22. The p-type clad layer 24 is a layer made of a p-type AlGaN-based semiconductor material and is exemplified by a Mg-doped AlGaN layer. The composition ratio of the p-type clad layer 24 is selected such that the molar fraction of AlN in the p-type clad layer 24 is higher than that of the active layer 20 and the molar fraction of AlN in the p-type clad layer 24 is lower than that of the electron block layer 22. The p-type clad layer 24 has a thickness of about 300 nm-700 nm. For example, the p-type clad layer 24 has a thickness of about 400 nm-600 nm.

The p-side electrode 26 is provided on the p-type clad layer 24 and is formed in the second region W2. The p-side electrode 26 is made of a material capable of establishing ohmic contact with the p-type clad layer 24. For example, the p-side electrode 26 is formed by a nickel (Ni)/gold (Au) stack structure. For example, the thickness of the Ni layer is about 60 nm, and the thickness of the Au layer is about 50 nm.

A p-type contact layer may be provided between the p-type clad layer 24 and the p-side electrode 26 to lower the contact resistance between the p-type clad layer 24 and the p-side electrode 26. The p-type contact layer may be made of an AlGaN-based semiconductor material or a GaN-based semiconductor material of a p-type having a composition ratio selected such that the Al content percentage thereof is lower than that of the p-type clad layer 24. It is preferable that the molar fraction of AlN in the p-type contact layer is 20% or lower, and it is more preferable that the molar fraction of AlN is 10% or lower.

The active layer 20, the electron block layer 22, and the p-type clad layer 24 are configured such that a side surface 32 (mesa surface) is inclined. The inclined side surface 32 is located between the first region W1 where the n-side electrode 28 is formed and the second region W2 where the p-side electrode 26 is formed. The side surface 32 is formed to have an angle of inclination $\theta a$ with respect to an interface 19 between the n-type clad layer 18 and the active layer 20. By inclining the side surface 32, deep ultraviolet light L emitted by the active layer 20 (e.g., a spot S) is caused to be rejected on the side surface 32 and to travel toward light extraction surface 12b of the substrate 12.

The angle of inclination $\theta a$ of the side surface 32 is configured to be not less than 15° and not more than 50°, and, preferably, not less than 20° and not more than 40°. By configuring the angle of inclination $\theta a$ of the side surface 32 to be in this angular range, the amount of deep ultraviolet light output from the light extraction surface 12b is increased and the light extraction efficiency is increased. The reason that this angular range is preferable will be discussed later.

The side surface 32 is coated with the protective layer 30. The protective layer 30 is made of an insulating material transparent to the deep ultraviolet light emitted by the active layer 20. For example, silicon oxide ($SiO_2$), silicon oxynitride (SiON), silicon nitride (SiN), aluminum oxide ($Al_2O_3$), aluminum nitride (AlN), or the like may be used for the protective layer 30. It is desirable that the protective layer 30 is made of a material having a low reflectivity for deep ultraviolet light. Among the materials listed above, $SiO_2$ (refractive index is 1.4) is preferable. By lowering the refractive index of the protective layer 30 and increasing the refractive index difference from the active layer 20 accordingly, the angular range in which total reflection on the side surface 32 occurs is enlarged and the deep ultraviolet reflectivity on the side surface 32 is increased. By using a transparent material for the protective layer 30, loss resulting from absorption of deep ultraviolet light by the protective layer 30 is reduced.

Figure 2:
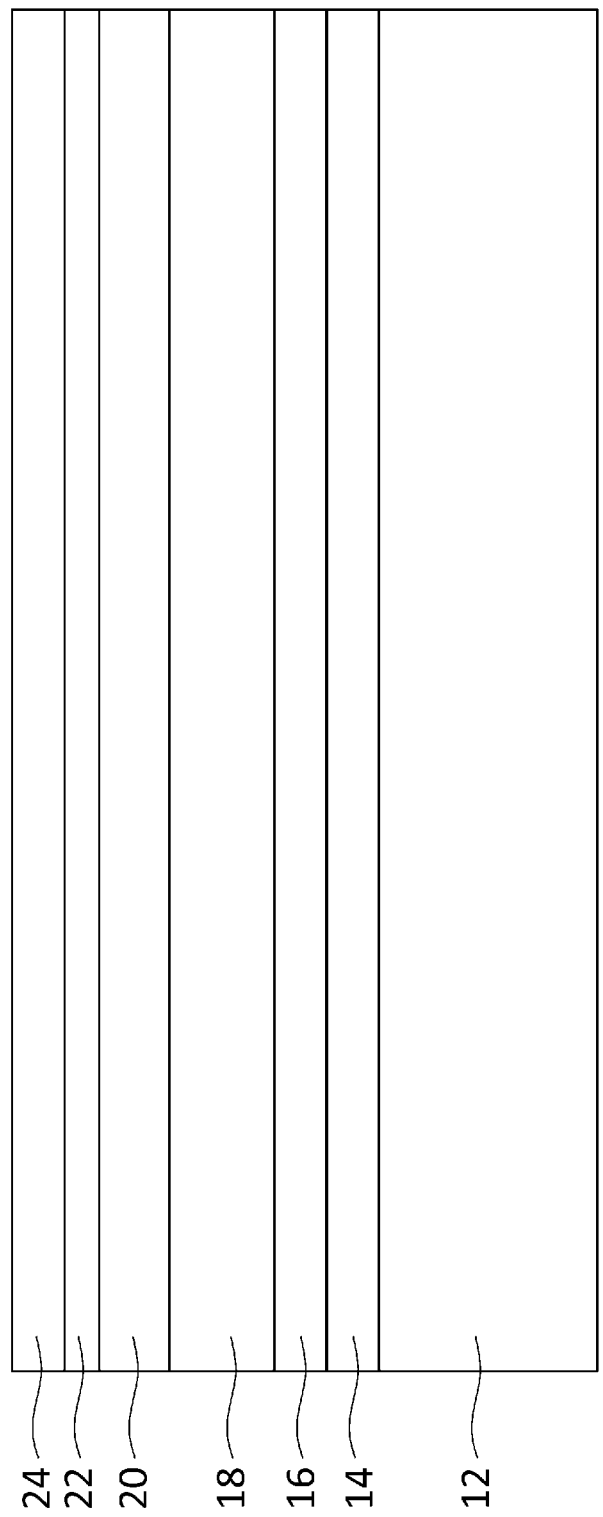
FIG. 2 is a cross sectional view schematically showing a step of manufacturing a deep ultraviolet light emitting device.

A description will now be given of a method of manufacturing the deep ultraviolet light emitting device 10 with reference to FIGS. 2-5. First, as shown in FIG. 2, the first base layer 14, the second base layer 16, the n-type clad layer 18, the active layer 20, the electron block layer 22, and the p-type clad layer 24 are stacked successively on the substrate 12. The second base layer 16, the n-type clad layer 18, the active layer 20, the electron block layer 22, and the p-type clad layer 24 made of an AlGaN-based semiconductor material can be formed by a well-known epitaxial growth method such as the metalorganic chemical vapor deposition (MOVPE) method and the molecular beam epitaxial (MBE) method.

Figure 3:
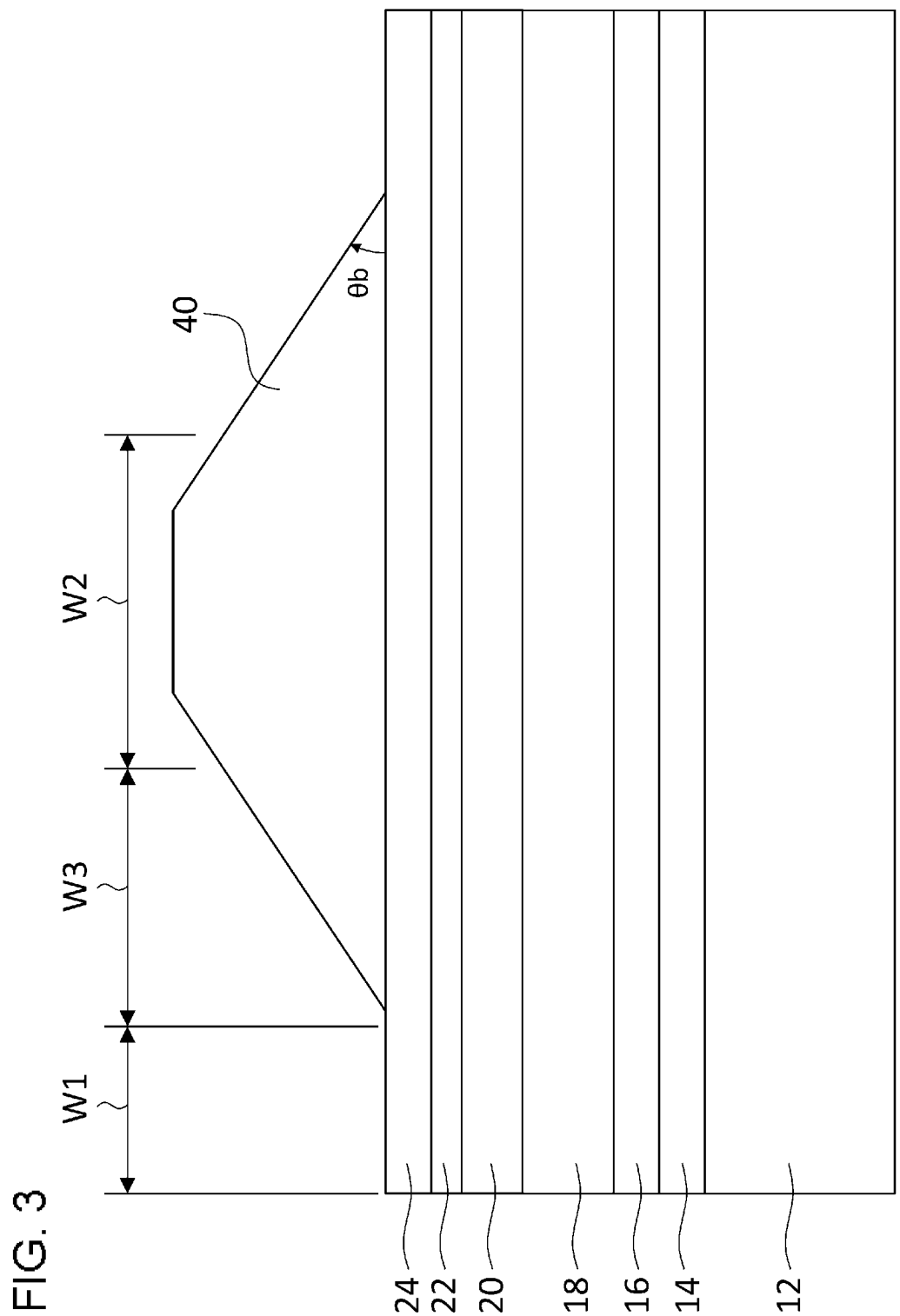
FIG. 3 is a cross sectional view schematically showing a step of manufacturing a deep ultraviolet light emitting device.

Subsequently, as shown in FIG. 3, a mask layer 40 is formed on the p-type clad layer 24. The mask layer 40 is formed on the second region W2 and the third region W3 of the p-type clad layer 24. The mask layer 40 is formed to have a predetermined angle of inclination $\theta b$ in the third region W3. The angle of inclination $\theta b$ of the mask layer is adjusted by controlling the post-baking temperature for the resist used after the resist is exposed to form a mask pattern. For example, by using a lower post-baking temperature for the resist, the angle of inclination $\theta b$ of the mask layer 40 is increased, and, by using a higher post-baking temperature for the resist, the angle of inclination $\theta b$ of the mask layer 40 is decreased. While the adjustment is affected by the material of the resist used, the angle of inclination $\theta b$ of the mask layer 40 can be adjusted between 70°-20° by adjusting the post-baking temperature between 100° C.-200° C.

Figure 4:
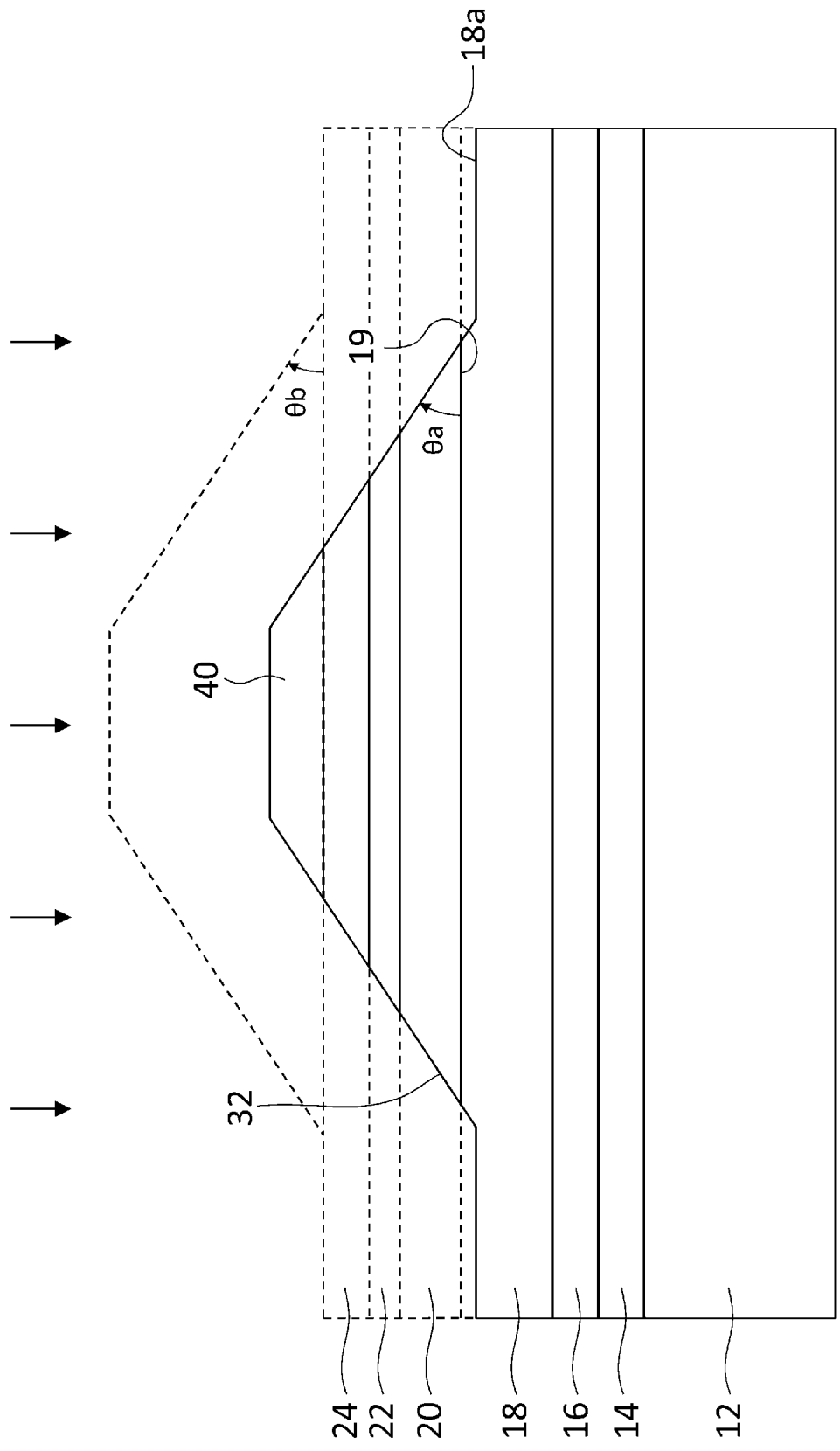
FIG. 4 is a cross sectional view schematically showing a step of manufacturing a deep ultraviolet light emitting device.

Subsequently, as shown in FIG. 4, the active layer 20, the electron block layer 22, and the p-type clad layer 24 are etched from above the mask layer 40. FIG. 4 shows the pre-etching structure in a broken line and shows the postetching structure in a solid line. The mask layer 40 and the semiconductor layers are dry-etched by using reactive ion etching, plasma, etc. to form the side surface 32 having the angle of inclination θa corresponding to the angle of inclination θb of the mask layer 40. The dry-etching step is performed until a top surface 18a of the n-type clad layer 18 is exposed. The top surface 18a of the n-type clad layer 18 may be formed to be at the same height as the interface 19 between the n-type clad layer 18 and the active layer 20 or formed to be positioned lower than the interface 19. In the latter case, a portion of the n-type clad layer 18 may be removed by this etching step.

The angle of inclination θa of the side surface 32 is determined by the angle of inclination θb of the mask layer 40 and the speed of etching the mask layer 40 and the semiconductor layers. For example, if the speed of etching the mask layer 40 is relatively higher than that of the semiconductor layers, the angle of inclination θa of the side surface 32 will be smaller than the angle of inclination θb of the mask layer 40. As a result, the angle of inclination θa of the side surface 32 can be adjusted in a range 15°-50° by adjusting the angle of inclination θb of the mask layer 40 in a range 20°-70°. It is difficult in terms of manufacturing to form the uniform side surface 32 having the angle of inclination less than 15°. In order to form the side surface 32 having the uniform angle of inclination θa, it is necessary to configure the angle of inclination θa to be 15° or larger. It is preferable to configure the angle to be 20° or larger.

Figure 5:
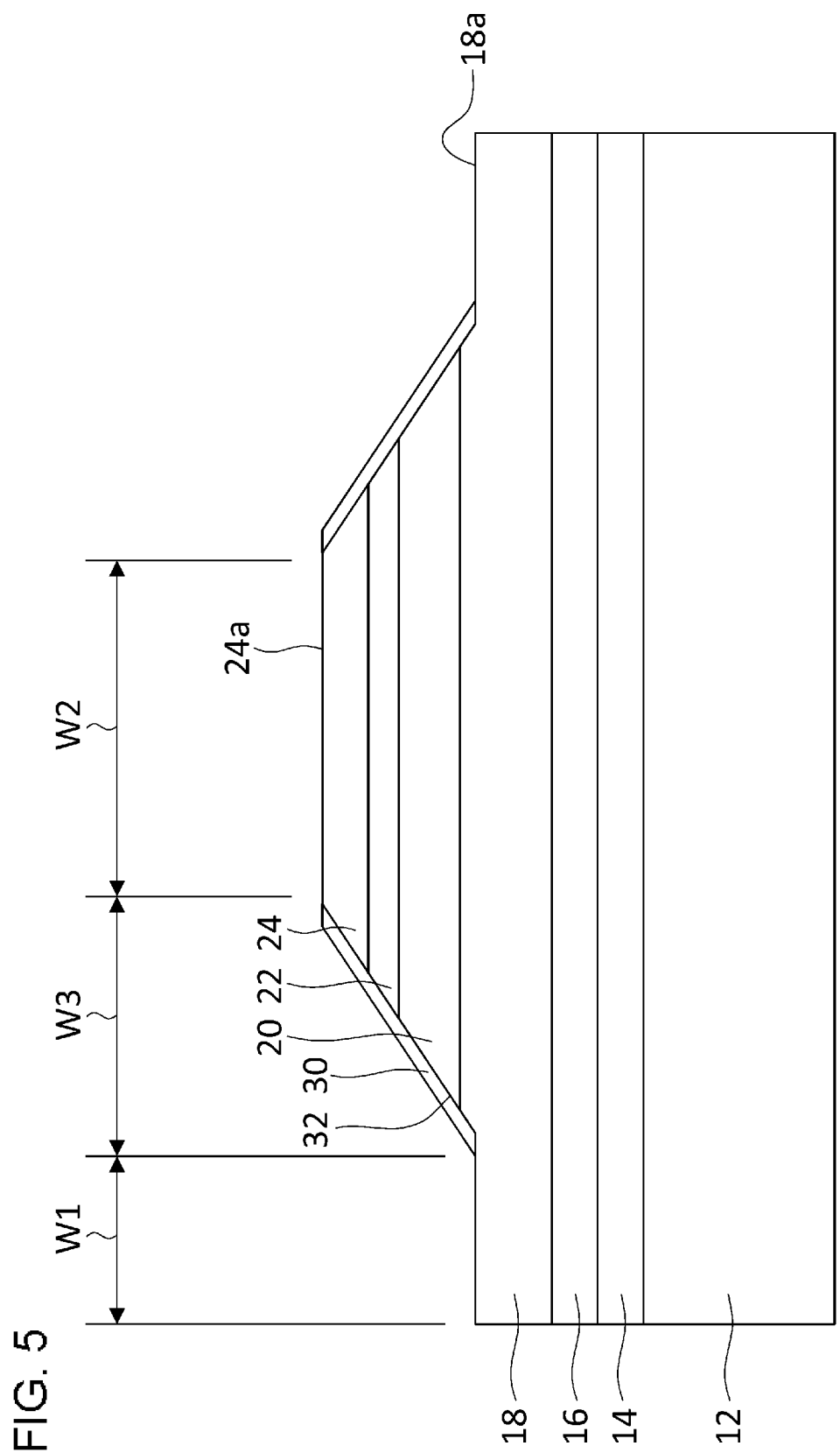
FIG. 5 is a cross sectional view schematically showing a step of manufacturing a deep ultraviolet light emitting device.

Subsequently, after removing the mask layer 40 that remains on the p-type clad layer 24, the protective layer 30 is formed as shown in FIG. 5. The protective layer 30 is provided to cover at least the active layer 20, the electron block layer 22, and the side surface 32 of the p-type clad layer 24. It is preferable that the protective layer 30 is formed to be thick enough to suitably reflect or totally reflect the deep ultraviolet light on the side surface 32. For example, the protective layer 30 may be configured to have a thickness of about 20 nm-300 nm.

The protective layer 30 may be selectively formed on the side surface 32 by forming it from above a mask provided in the first region W1 and the third region W3. Alternatively, the protective layer may be formed to cover the entirety of the top surface 18a of the n-type clad layer 18, the side surface 32, and the top surface 24a of the p-type clad layer 24, whereupon the portions corresponding to the first region W1 and the third region W3 may be removed. In the latter case, the portions of the protective layer may be removed by dry etching using plasma, etc. Alternatively, the portions of the protective layer may be removed by wet etching using hydrofluoric acid (HF), etc.

Subsequently, the n-side electrode 28 is formed on the top surface 18a of the n-type clad layer 18 exposed in the first region W1, and the p-side electrode 26 is formed on the top surface 24a of the p-type clad layer 24 exposed in the second region W2. An n-type contact layer may be formed on the top surface 18a of the n-type clad layer 18, and the n-side electrode 28 may be formed on the n-type contact layer. Similarly, a p-type contact layer may be formed on the top surface 24a of the p-type clad layer 24, and the p-side electrode 26 may be formed on the p-type contact layer. The deep ultraviolet light emitting device 10 shown in FIG. 1 is manufactured through the steps described above.

Figure 6:
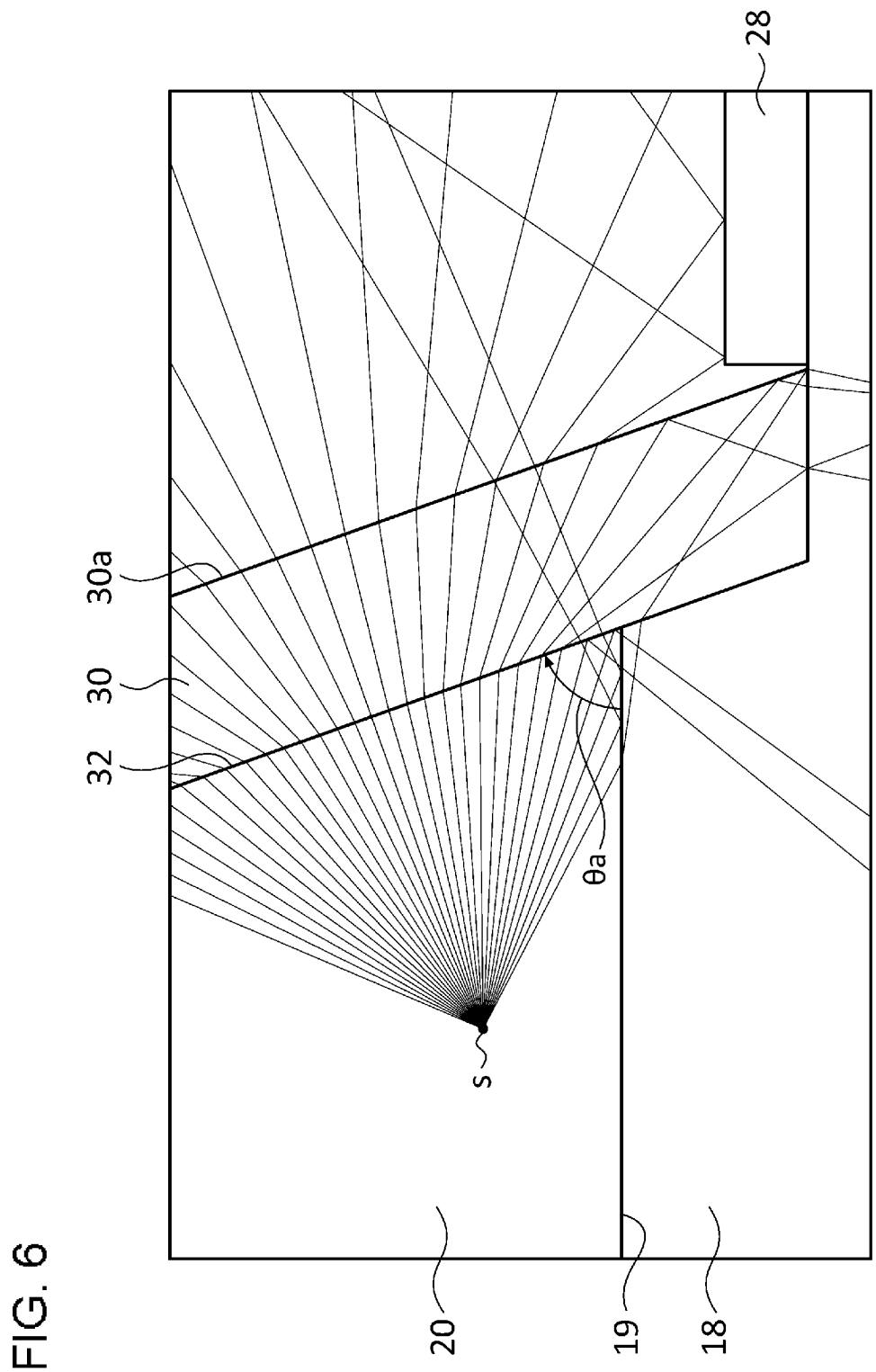
FIG. 6 is a graph showing a simulation result of a deep ultraviolet light emitting device according to a comparative example.

A description will now be given of the benefit provided by the deep ultraviolet light emitting device 10 according to the embodiment. FIG. 6 is a graph showing a simulation result of a deep ultraviolet light emitting device according to a comparative example and shows a result of ray tracing light rays in the case the angle of inclination θa of the side surface 32 is 70°. As illustrated, it is revealed that much of the light rays traveling toward the side surface 32 leaks outside from an outer surface 30a of the protective layer 30, and the proportion of the light rays traveling toward the n-type clad layer 18 after being reflected by the side surface 32 is extremely small. Thus, in the case the angle of inclination θa of the side surface 32 is large, it is impossible to extract the deep ultraviolet light traveling toward the side surface 32 from the light extraction surface 12b of the substrate 12.

Figure 7:
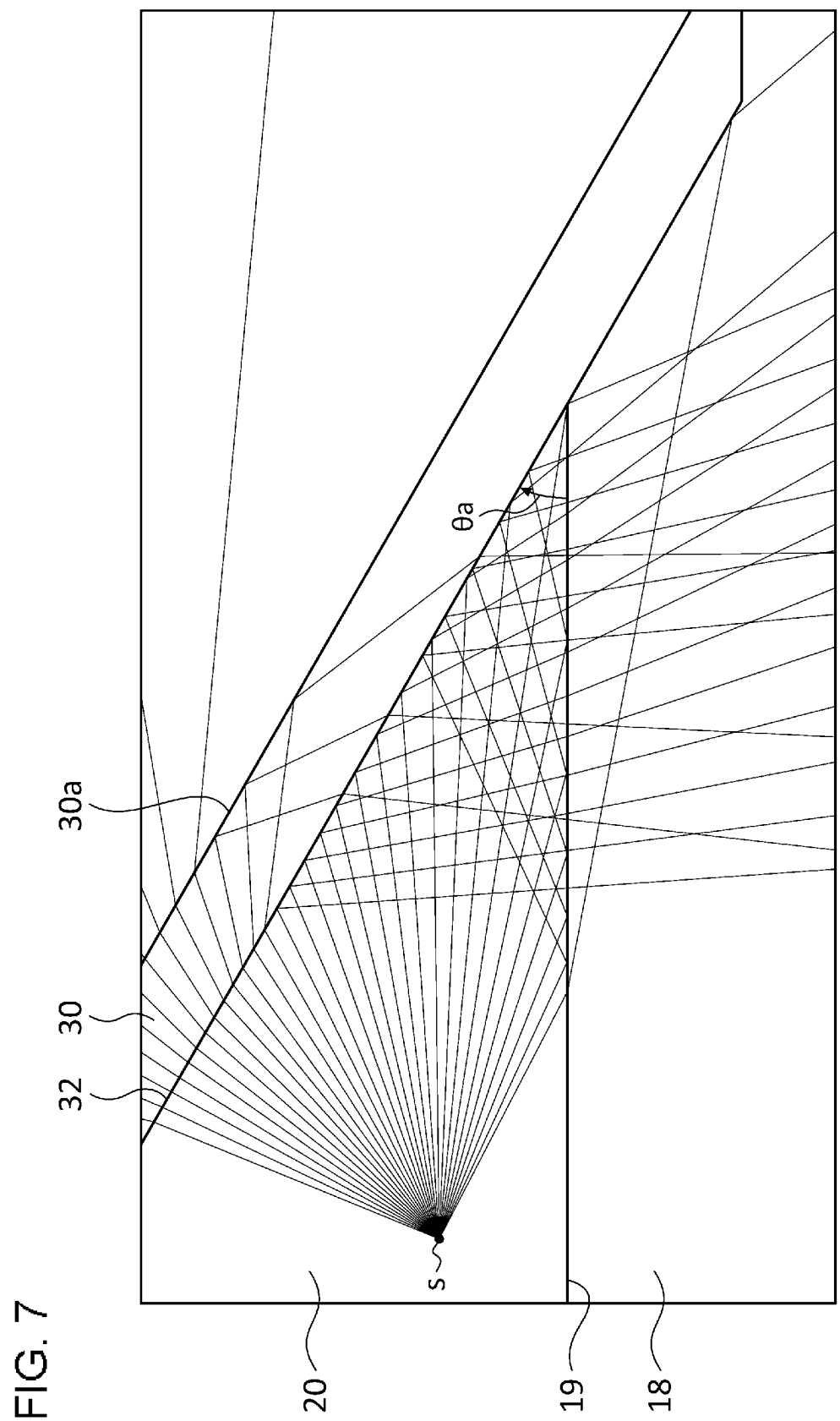
FIG. 7 is a graph showing a simulation result of a deep ultraviolet light emitting device according to the embodiment.

FIG. 7 is a graph showing a simulation result of a deep ultraviolet light emitting device according to the embodiment and shows a result of tracing light rays in the case the angle of inclination θa of the side surface 32 is 30°. As illustrated, a portion of the light rays traveling toward the side surface 32 leaks outside from the outer surface 30a of the protective layer 30, but much of the light rays traveling toward the side surface 32 is reflected by the side surface 32 or the outer surface 30a of the protective layer 30 and travels toward the n-type clad layer 18. Further, since the angle of incidence of the light rays on the interface 19 between the n-type clad layer 18 and the active layer 20 is small, the light rays are extracted outside without being totally reflected by the light extraction surface 12b of the substrate 12. Thus, by configuring the angle of inclination θa of the side surface 32 to be small, a portion of the deep ultraviolet light traveling toward the side surface 32 is extracted from the light extraction surface 12b of the substrate 12.

Figure 8:
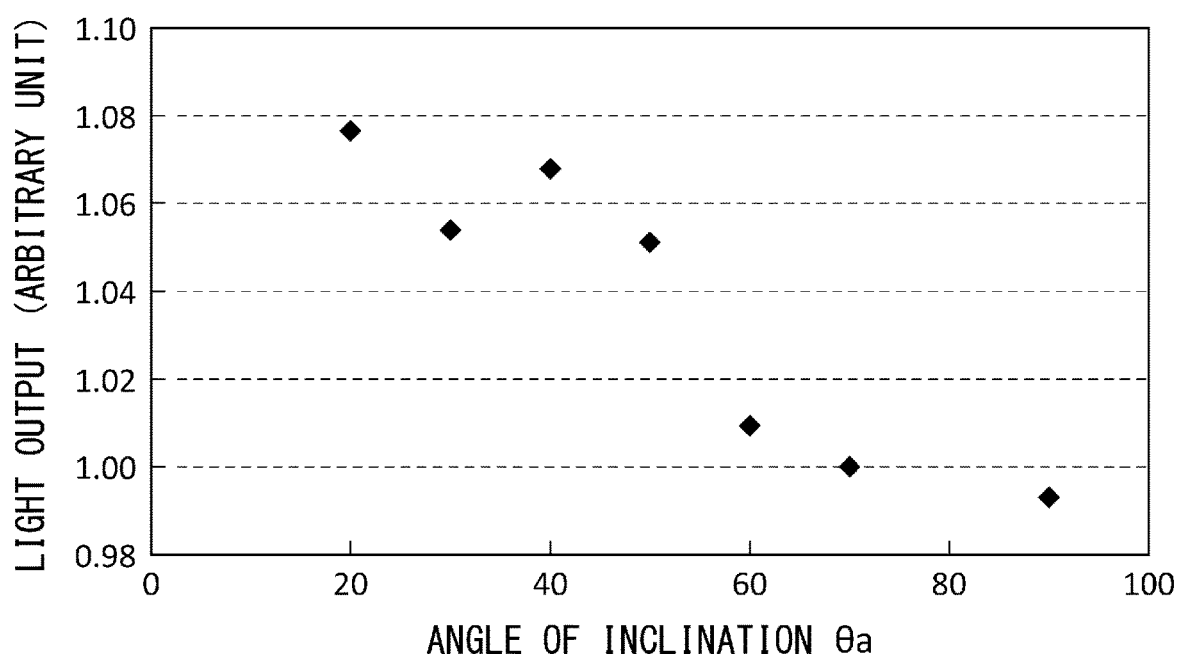
FIG. 8 is a graph showing a relationship between the angle of inclination of the side surface and the amount of light output from the light extraction surface.

FIG. 8 is a graph showing a relationship between the angle of inclination θa of the side surface 32 and the amount of light output from the light extraction surface 12b. The graph is generated by executing a simulation by tracing light rays in a model simulating the structure of the deep ultraviolet light emitting device described above and calculating the amount of light output from the light extraction surface 12b. In the calculation model, a sapphire substrate (refractive index is 1.83) of a thickness of 400 μm, an AlN base layer (refractive index is 2.1) of a thickness of 2 μm, an AlGaN layer (refractive index is 2.3) of a thickness of 2 μm, and an active layer (refractive index is 2.56) of a thickness of 500 nm are stacked. A total absorber simulating the p-type semiconductor layer is provided on the active layer as a boundary layer. The side surface of the active layer is inclined, and a silicon oxide layer (refractive index is 1.4) is provided on the inclined surface. The angle of inclination θa of the side surface of the active layer is varied in a range 20°-90°, and the amount of light output from the sapphire substrate is determined. The vertical axis of the graph represents a relative value determined when the amount of light output in the presence of the angle of inclination θa=70° is defined to be 1.

As illustrated, it is revealed that the amount of output light is relatively small in a range 60°-90° of the angle of inclination θa, and the amount of output light is increased by about 5%-8% in a range 20°-50° of the angle of inclination θa. The simulation result reveals that the light extraction efficiency is increased by configuring the angle of inclination θa of the side surface 32 of the active layer 20 to be 50° or smaller.

Figure 9:
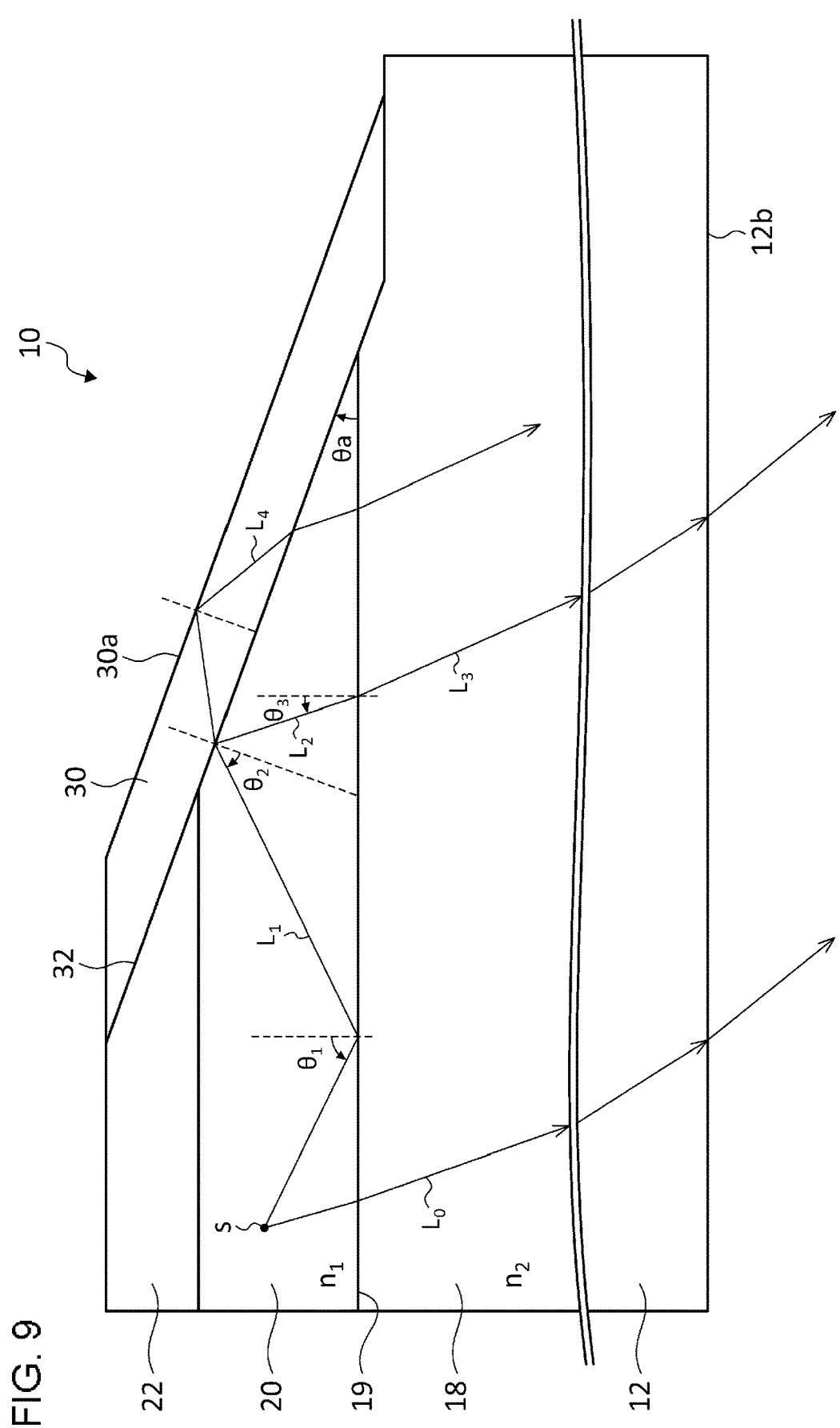
FIG. 9 schematically shows the benefit provided by the deep ultraviolet light emitting device according to the embodiment.

FIG. 9 schematically shows the benefit provided by the deep ultraviolet light emitting device 10 according to the embodiment and shows how the deep ultraviolet light created in the active layer 20 propagates. A description will be given of the reason that the light extraction efficiency is increased when the angle of inclination θa is 50° or smaller with reference to FIG. 9.

The deep ultraviolet light created at an arbitrary spot S in the active layer 20 mainly travels toward the interface 19 between the n-type clad layer 18 and the active layer 20 or the interface between the active layer 20 and the electron block layer 22. A portion of the deep ultraviolet light incident on the interface 19 between the n-type clad layer 18 and the active layer 20 propagates toward the light extraction surface 12b of the substrate 12 and is output outside from the light extraction surface 12b. Further, a portion of the deep ultraviolet light incident on the interface 19 is reflected by the interface 19, propagates inside the active layer 20, and travels toward the side surface 32.

The direction in which the deep ultraviolet light created in the active layer 20 propagates is determined by the direction of output at the wave source S and the refractive indices of the layers constituting the deep ultraviolet light emitting device 10. Denoting the incidence angle of the deep ultraviolet light incident on the interface 19 between the n-type clad layer 18 and the active layer 20 by $\theta_1$ and denoting the refractive index of the active layer 20 by $n_1$, the deep ultraviolet light that meets a relationship $\theta_1 < \sin^{-1}(1/n_1) = \theta_{C1}$ is output outside the deep ultraviolet light emitting device 10 from the light extraction surface 12b. Given that the active layer 20 is made of an AlGaN-based semiconductor material, the critical angle $\theta_{C1}$ to enable the output (hereinafter, also referred to as the first critical angle $\theta_{C1}$) is such that the first critical angle $\theta_{C1}$=22-25° approximately, given that the refractive index $n_1$=2.4-2.6 approximately. When the incidence angle $\theta_1$ is smaller than the first critical angle $\theta_{C1}$, total reflection does not occur on the light extraction surface 12b and the deep ultraviolet light is output outside from the light extraction surface 12b.

Total reflection occurs on the interface 19 between the n-type clad layer 18 and the active layer 20 so that the deep ultraviolet light having the incidence angle $\theta_1$ in a predetermine range is not output from the interface 19 to the n-type clad layer 18. The higher the AlN composition ratio (i.e., the larger the band gap), the lower the refractive index of an AlGaN-based semiconductor material tends to be. The refractive index $n_2$ of the n-type clad layer 18 having a relatively high AlN composition ratio is lower than the refractive index $n_1$ of the active layer 20 having a relatively lower AlN composition ratio. In the case of the n-type clad layer 18 having an AlN composition ratio of 40% or higher, the refractive index $n_2$ thereof is such that $n_2$=2.2-2.3 approximately. Using the value, the critical angle $\theta_{C2}$ at the interface 19 (hereinafter, also referred to as the second critical angle $\theta_{C2}$) will be such that $\theta_{C2}=\sin^{-1}(n_2/n_1)$=58-73 approximately.

Based on the foregoing, it is learned that the deep ultraviolet light is output outside from the light extraction surface 12b as indicated by a light ray $L_0$ provided that the incidence angle $\theta_1$ of the deep ultraviolet light incident on the interface 19 is smaller than the first critical angle $\theta_{C1}$. Meanwhile, when the incidence angle $\theta_1$ of the deep ultraviolet light incident on the interface 19 is larger than the second critical angle $\theta_{C2}$, the deep ultraviolet light is totally reflected by the interface 19 and travels toward the side surface 32 as indicated by a light ray $L_1$. The incidence angle $\theta_2$ of the deep ultraviolet light incident on the side surface 32 is denoted geometrically by $\theta_2=|\theta_1-\theta a|$, using the incidence angle (or the reflecting angle) $\theta_1$ on the interface 19 and the angle of inclination $\theta a$ of the side surface 32.

The deep ultraviolet light reflected by the side surface 32 changes its direction in accordance with the angle of inclination $\theta a$ of the side surface 32 and is incident on the interface 19 again at an incidence angle $\theta 3$ as indicated by a light ray $L_2$. Further, the as indicated by a light ray $L_4$, the deep ultraviolet light that is not reflected by the side surface 32, transmitted through the protective layer 30, and reflected by the outer surface 30a of the protective layer 30 is incident on the interface 19 again also at the incidence angle $\theta 3$. The angle $\theta 3$ of the light incident on the interface 19 again is denoted geometrically by $\theta_3=|\theta_1-2\theta a|$ using the first incidence angle (or the reflecting angle) $\theta_1$ on the interface 19 and the angle of inclination $\theta a$ of the side surface 32.

When the angle $\theta 3$ of the light incident on the interface 19 again is smaller than the first critical angle $\theta_{C1}$ described above, the deep ultraviolet light is output from the light extraction surface 12b as indicated by a light ray $L_3$. In other words, the deep ultraviolet light traveling toward the side surface 32 of the active layer 20 is extracted outside from the light extraction surface 12b provided that the angle of incidence $\theta a$ is such that the first incidence angle $\theta_1$ that meets a condition $\theta_1-2\theta a|<\theta_{C1}$ (hereinafter, also referred to as a light extraction condition) is found. The condition of the angle of inclination $\theta a$ is given by the following expression (1).

$$\theta_a < \frac{\pi/2 + \sin^{-1}(1/n_1)}{2} \quad (1)$$

The angle of inclination $\theta a$ that meets the condition will be about 56-58 when the right side of the above expression (1) is calculated by assuming that the refractive index $n_1$=2.4-2.6. Therefore, the deep ultraviolet light that meets the aforementioned light extraction condition is produced by configuring the angle of inclination $\theta a$ to be smaller than this upper limit angle. By configuring the angle of inclination $\theta a$ to be even smaller, the angular range of the incidence angle $\theta_1$ that meets the light extraction condition is enlarged. Based on the foregoing study, it can be said that the angle of inclination $\theta a$ of the side surface 32 is preferably 50° or smaller and, more preferably, 40° or smaller. In the case the angle of inclination $\theta a$=40°, for example, most of the deep ultraviolet light having the incidence angle $\theta_1$ of 63° or larger, i.e., most of the deep ultraviolet light totally reflected by the interface 19 is caused to be incident on the interface 19 again at the incidence angle $\theta 3$ smaller than the first critical angle $\theta_{C1}$.

The direction of output of the deep ultraviolet light created in the active layer 20 varies depending on the AlN composition ratio of the active layer 20. In particular, when the AlN composition ratio of the active layer 20 is increased in order to output deep ultraviolet light of a short wavelength (310 nm or shorter), the light component in a direction perpendicular to the interface 19 tends to be reduced and the light component in a direction along the interface 19 tends to be increased. According to the embodiment, the direction of the deep ultraviolet light that cannot travel toward the light extraction surface 12b as a result of being reflected or totally reflected by the interface 19 can be changed properly by configuring the angle of inclination $\theta a$ of the side surface 32 properly. Thus, according to the embodiment, the efficiency of light extraction from the light extraction surface 12b in the deep ultraviolet light emitting device 10 for outputting deep ultraviolet light of a short wavelength is increased.

Described above is an explanation based on an exemplary embodiment. The embodiment is intended to be illustrative only and it will be understood by those skilled in the art that various design changes are possible and various modifications are possible and that such modifications are also within the scope of the present invention.

What is claimed is:

1. A deep ultraviolet light emitting device comprising:
a sapphire substrate having a light extraction surface;
an n-type semiconductor layer provided on the sapphire substrate;
an n-side electrode provided in a partial region on the n-type semiconductor layer;
an active layer provided in a region on the n-type semiconductor layer different from the partial region and having a band gap of 3.4 eV or larger;
a p-type semiconductor layer provided on the active layer;
a p-side electrode provided on a top surface of the p-type semiconductor layer; and
a protective layer covering plural side surfaces of each of the active layer and the p-type semiconductor layer, the protective layer being transparent to deep ultraviolet light emitted by the active layer, wherein
the top surface of the p-type semiconductor layer has a first portion with which the p-side electrode is in physical contact and a second portion with which the p-side electrode is not in physical contact,
the protective layer is in physical contact with the plural side surfaces of each of the active layer and the p-type semiconductor,
the protective layer is in physical contact with a top surface of the n-type semiconductor layer,
the protective layer is not in physical contact with the top surface of the p-type semiconductor layer,
the deep ultraviolet light emitted by the active layer is output outside from the light extraction surface, and
the plural side surfaces of each of the active layer and the p-type semiconductor layer are inclined with respect to an interface between the n-type semiconductor layer and the active layer, and an angle of inclination of the plural side surfaces are not less than 15° and not more than 50°;
wherein the n-type semiconductor layer has a side surface perpendicular to the interface and the side surface of the n-type semiconductor layer is not coated with the protective layer.

2. The deep ultraviolet light emitting device according to claim 1, wherein
the n-type semiconductor layer, the active layer, and the p-type semiconductor layer are AlGaN-based semiconductor layers.

3. The deep ultraviolet light emitting device according to claim 1, wherein the protective layer comprises silicon oxide (SiO$_2$), silicon oxynitride (SiON), silicon nitride (SiN), aluminum oxide (Al$_2$O$_3$), or aluminum nitride (AlN).

4. The deep ultraviolet light emitting device according to claim 1, wherein the angle of inclination of the plural side surfaces of each of the active layer and the p-type semiconductor layer are not less than 20° and not more than 40°.

5. A deep ultraviolet light emitting device comprising:
a sapphire substrate having a light extraction surface;
an n-type semiconductor layer provided on the sapphire substrate;
an n-side electrode provided in a partial region on the n-type semiconductor layer;
an active layer provided in a region on the n-type semiconductor layer different from the partial region and having a band gap of 3.4 eV or larger;
a p-type semiconductor layer provided on the active layer;
a p-side electrode provided on a top surface of the p-type semiconductor layer; and
a protective layer covering plural side surfaces of each of the active layer and the p-type semiconductor layer, the protective layer being transparent to deep ultraviolet light emitted by the active layer, wherein
the top surface of the p-type semiconductor layer has a first portion with which the p-side electrode is in physical contact and a second portion with which the p-side electrode is not in physical contact,
the protective layer is in physical contact with the plural side surfaces of each of the active layer and the p-type semiconductor,
the protective layer is in physical contact with a top surface of the n-type semiconductor layer,
the protective layer is not in physical contact with the top surface of the p-type semiconductor layer,
the deep ultraviolet light emitted by the active layer is output outside from the light extraction surface, and
the plural side surfaces of each of the active layer and the p-type semiconductor layer are inclined with respect to an interface between the n-type semiconductor layer and the active layer, and an angle θa of inclination of the plural side surfaces meet a relationship of the following expression $$\theta_a < \frac{\pi/2 + \sin^{-1}(1/n_1)}{2}$$

wherein n$_1$ is a refractive index of the active layer;
wherein the n-type semiconductor layer has a side surface perpendicular to the interface and the side surface of the n-type semiconductor layer is not coated with the protective layer.

* * * * *